United States Patent
Cha

(10) Patent No.: US 10,698,763 B2
(45) Date of Patent: Jun. 30, 2020

(54) SEMICONDUCTOR MEMORY DEVICES, MEMORY SYSTEMS AND METHODS OF OPERATING SEMICONDUCTOR MEMORY DEVICES

(71) Applicant: SAMSUNG ELECTRONICS CO., LTD., Suwon-si (KR)

(72) Inventor: Sang-Uhn Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 54 days.

(21) Appl. No.: 16/177,497

(22) Filed: Nov. 1, 2018

(65) Prior Publication Data

US 2019/0229753 A1    Jul. 25, 2019

(30) Foreign Application Priority Data

Jan. 25, 2018    (KR) .................. 10-2018-0009188

(51) Int. Cl.
*G06F 11/10* (2006.01)
*H03M 13/15* (2006.01)

(52) U.S. Cl.
CPC ........ *G06F 11/1048* (2013.01); *G06F 11/108* (2013.01); *G06F 11/1012* (2013.01); *G06F 11/1044* (2013.01); *H03M 13/1575* (2013.01)

(58) Field of Classification Search
CPC ............ G06F 11/1048; G06F 11/1012; H03M 13/1575
See application file for complete search history.

(56) References Cited

U.S. PATENT DOCUMENTS

| 3,755,779 | A |   | 8/1973  | Price                       |
|-----------|---|---|---------|-----------------------------|
| 4,058,851 | A | * | 11/1977 | Scheuneman ....... G06F 11/1052 |
|           |   |   |         | 714/6.2                     |
| 4,139,148 | A |   | 2/1979  | Scheuneman et al.           |

(Continued)

FOREIGN PATENT DOCUMENTS

| JP | 5-197580 A      | 8/1993 |
| JP | 11-45595 A      | 2/1999 |
| KR | 10-2016-0008786 A | 1/2016 |

OTHER PUBLICATIONS

Communication dated Oct. 8, 2019, issued by the Singapore Patent Office in counterpart Singapore Application No. 10201900023R.

*Primary Examiner* — Joseph D Torres
(74) *Attorney, Agent, or Firm* — Sughrue Mion, PLLC

(57) ABSTRACT

A semiconductor memory device is provided. The device includes a memory cell array including a plurality of dynamic memory cells; an error correction code (ECC) engine; an input/output (I/O) gating circuit connected between the ECC engine and the memory cell array; an error information register configured to store an error address and a first syndrome, the error address and the first syndrome being associated with a first error bit in a first codeword stored in a first page of the memory cell array; and a control logic configured to, based on the first codeword being read again and including a second error bit which is different from the first error bit, recover a second syndrome associated with the second error bit by using the first syndrome stored in the error information register and sequentially correct the first error bit and the second error bit.

20 Claims, 17 Drawing Sheets

(56) References Cited

U.S. PATENT DOCUMENTS

| | | | | |
|---|---|---|---|---|
| 4,245,303 | A * | 1/1981 | Durvasula | G06F 13/1673 |
| | | | | 710/3 |
| 4,319,356 | A * | 3/1982 | Kocol | G06F 11/1076 |
| | | | | 714/54 |
| 4,319,357 | A | 3/1982 | Bossen | |
| 4,597,084 | A * | 6/1986 | Dynneson | G06F 11/1616 |
| | | | | 714/805 |
| 5,502,732 | A * | 3/1996 | Arroyo | G06F 11/2215 |
| | | | | 714/703 |
| 7,117,420 | B1 * | 10/2006 | Yeung | H03M 13/095 |
| | | | | 714/763 |
| 7,437,597 | B1 * | 10/2008 | Kruckemyer | G06F 11/1064 |
| | | | | 714/6.11 |
| 9,362,953 | B2 | 6/2016 | Kern et al. | |
| 9,529,665 | B2 | 12/2016 | Gendler et al. | |
| 9,800,271 | B2 | 10/2017 | Jung et al. | |
| 2002/0018389 | A1 | 2/2002 | Ito et al. | |
| 2005/0240838 | A1 * | 10/2005 | Iwai | G11C 29/42 |
| | | | | 714/718 |
| 2013/0179751 | A1 | 7/2013 | Linstadt | |
| 2016/0042809 | A1 * | 2/2016 | Kim | G11C 29/42 |
| | | | | 714/719 |
| 2017/0264318 | A1 | 9/2017 | Hatsuda | |
| 2017/0365361 | A1 | 12/2017 | Cha et al. | |

* cited by examiner

US 10,698,763 B2

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATION

This application claims priority under 35 U.S.C. § 0.119 from Korean Patent Application No. 10-2018-0009188, filed on Jan. 25, 2018 in the Korean Intellectual Property Office, the disclosure of which is incorporated herein by reference in its entirety.

BACKGROUND

Methods and apparatuses consistent with example embodiments relate to memory, and more particularly to semiconductor memory devices, memory systems and methods of operating semiconductor memory devices.

Semiconductor memory devices may be classified into non-volatile memory devices, such as flash memory devices, and volatile memory devices, such as Dynamic random-access memories (DRAMs). High speed operation and cost efficiency of DRAMs make it possible for DRAMs to be used for system memories. Bit errors of memory cells in DRAMs have increased and DRAM yield has decreased due to continued size reduction in fabrication design rule of DRAMs. Therefore, there is a need for credibility of the semiconductor memory device.

SUMMARY

According to an aspect of an example embodiment, there is provided a semiconductor memory device including: a memory cell array including a plurality of dynamic memory cells; an error correction code engine (an ECC engine); an input/output gating circuit (an I/O gating circuit) connected between the ECC engine and the memory cell array; an error information register configured to store an error address and a first syndrome, the error address and the first syndrome being associated with a first error bit in a first codeword stored in a first page of the memory cell array; and a control logic circuit configured to control the ECC engine, the I/O gating circuit and the error information register based on an address and a command from an external memory controller, and based on the first codeword being read again and including a second error bit which is different from the first error bit, recover a second syndrome associated with the second error bit by using the first syndrome stored in the error information register and sequentially correct the first error bit and the second error bit.

According to an aspect of another example embodiment, there is provided a memory system including: at least one semiconductor memory device; and a memory controller configured to control the at least one semiconductor memory device, wherein the at least one semiconductor memory device includes: a memory cell array including a plurality of dynamic memory cells; an error correction code engine (an ECC engine); an input/output gating circuit (an I/O gating circuit) connected between the ECC engine and the memory cell array; an error information register configured to store an error address and a first syndrome, the error address and the first syndrome being associated with a first error bit in a first codeword stored in a first page of the memory cell array; and a control logic circuit configured to control the ECC engine, the I/O gating circuit and the error information register based on an address and a command from the memory controller, and control, when the first codeword is read again from the first page and includes a second error bit different from the first error bit, the ECC engine to recover a second syndrome associated with the second error bit by using the first syndrome stored in the error information register and sequentially correct the first error bit and the second error bit.

According to an aspect of yet another example embodiment, there is provided a method of operating a semiconductor memory device including a memory cell array, the method of operating the semiconductor memory device including: performing, in an error correction code engine (an ECC engine), ECC decoding on a first codeword as read from a memory location of the memory cell array, the first codeword corresponding to an access address; storing an error address and a first syndrome in an error information register based on a first error bit being detected in the first codeword, the error address and the first syndrome being associated with the first error bit; recovering, in the ECC engine, a second syndrome associated with a second error bit by using the first syndrome stored in the error information register based on the first codeword being read again from the memory location and including the second error bit which is different from the first error bit; and correcting, in the ECC engine, the first error bit and the second error bit by using the first syndrome and the second syndrome.

BRIEF DESCRIPTION OF THE DRAWINGS

The above and other aspects, features and advantages will be described below in more detail with reference to the accompanying drawings in which.

DETAILED DESCRIPTION

Hereinafter, example embodiments will be described more fully with reference to the accompanying drawings.

Figure 1:
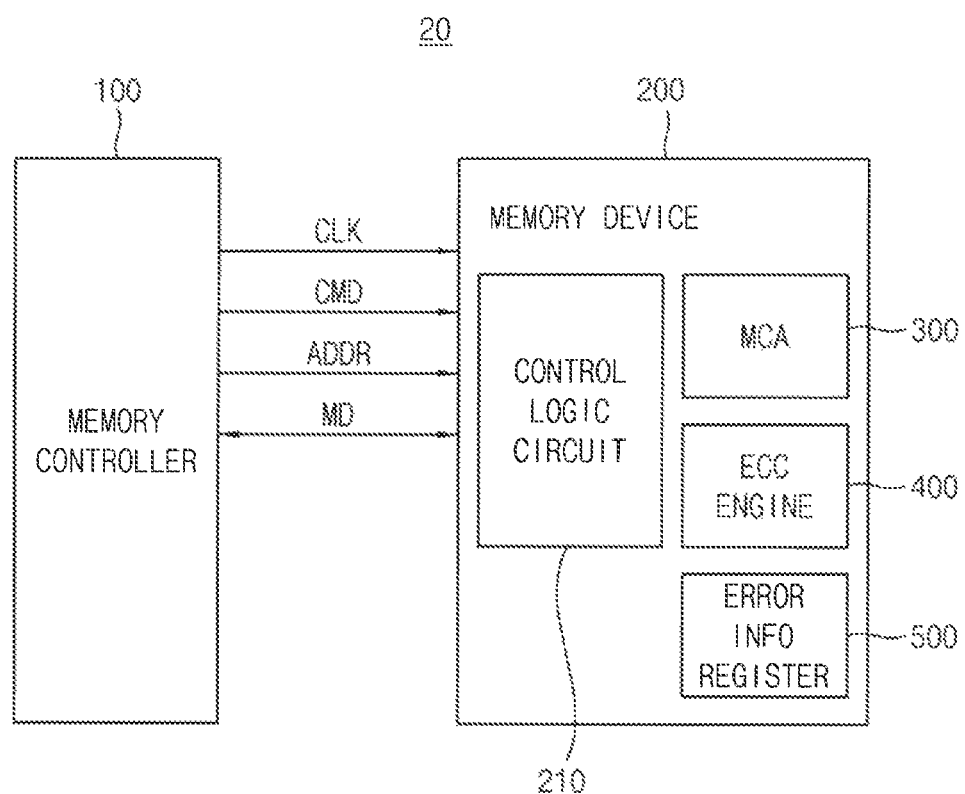
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and at least one semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address signal ADDR to the semiconductor memory device 200 and exchanges main data MD with the semiconductor memory device 200.

The semiconductor memory device 200 includes a memory cell array 300 that stores the main data MD and parity bits, an error correction code (ECC) engine 400, a control logic circuit 210 and an error information register 500.

The ECC engine 400, under control of the control logic circuit 210, may read data (i.e., a first codeword) from a target page of the memory cell array 300 by unit of a codeword, perform ECC decoding on the first codeword, and may store an error address and a first syndrome in the error information register 500 when the first codeword includes a first error bit. The error address and the first syndrome may be associated with the first error bit.

The ECC engine 400 may read the first codeword from the target page again, recover a second syndrome associated with a second error bit by using the first syndrome stored in the error information register 500 when the first codeword includes the second error bit different from the first error bit, and may correct the first error bit and the second error bit by using the first syndrome and the second syndrome. The ECC engine 400 may sequentially correct the first error bit and the second error bit.

Figure 2:
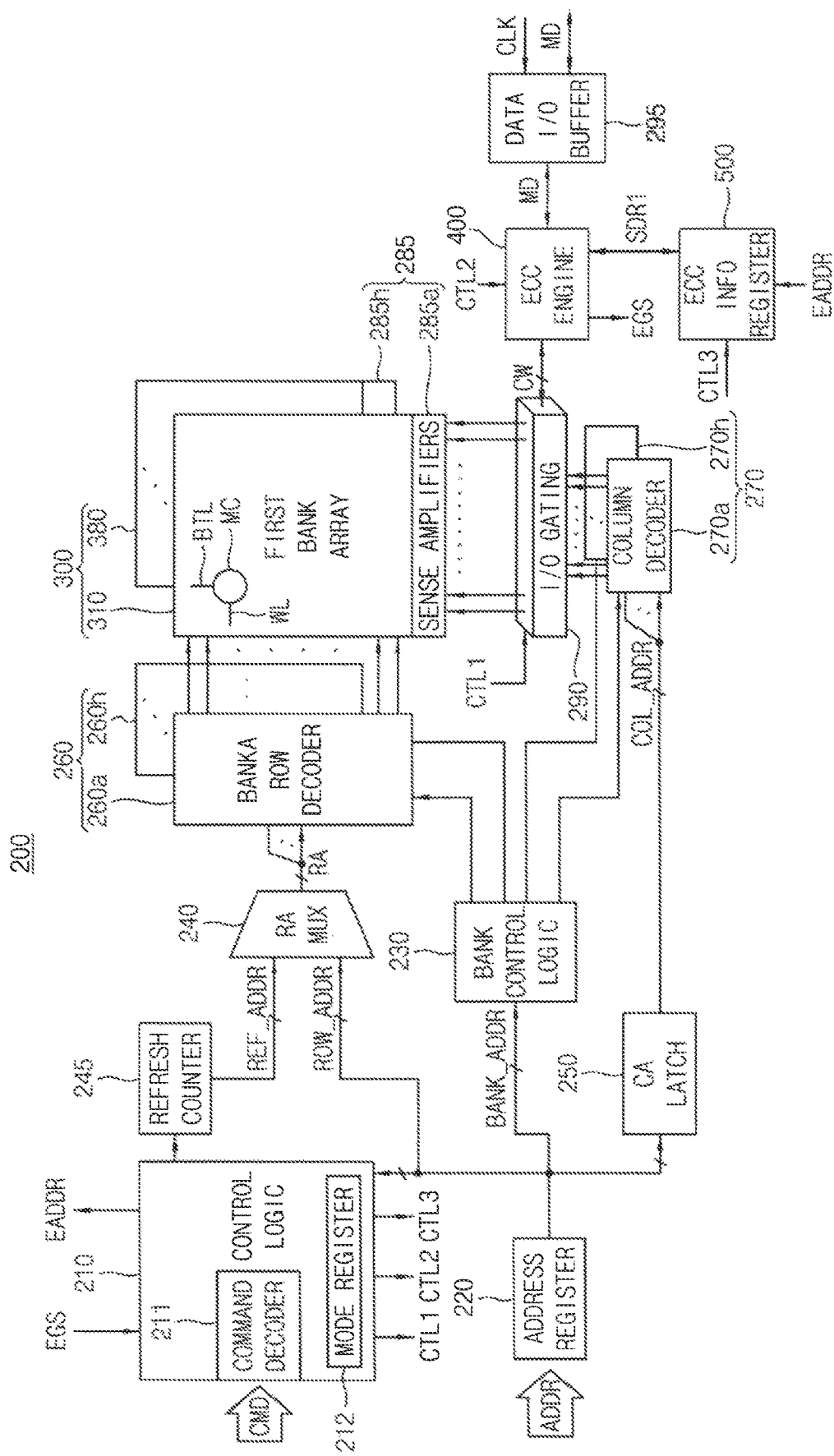
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 includes the control logic circuit 210, an address register 220, a bank control logic 230, a refresh counter 245, a row address multiplexer 240, a column address latch 250, a row decoder 260, a column decoder 270, the memory cell array 300, a sense amplifier 285, an input/output (I/O) gating circuit 290, the ECC engine 400, a data I/O buffer 295 and the error information register 500.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier 285 includes first through eighth bank sense amplifiers 285a~285h respectively coupled to the first through eighth bank arrays 310~380. Each of the first through eighth bank arrays 310~380 includes a plurality of memory cells MC formed at intersections of a plurality of word-lines WL and a plurality of bit-line BTL.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some example embodiments, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address COL_ADDR through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310~380 may be provided to the data I/O buffer 295 from the memory controller 100, may be provided to the ECC engine 400 from the data I/O buffer 295, the ECC engine 400 may perform ECC encoding on the main data MD to generate parity bits, the ECC engine 400 may provide the main data MD and the parity bits to the I/O gating circuit 290 and the I/O gating circuit 290 may write the main data MD and the parity bits in the target page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The ECC engine 400 performs ECC decoding on a first codeword read from a portion (i.e., a sub-page) of the target page in the memory cell array 300 and may store a first syndrome SDR1 associated with a first error bit in the error information register 500 while correcting the first error bit when the first error bit is detected in the main data of the first codeword.

The ECC engine 400 may be implemented with a single error correction code that detects a single bit error in the main data MD and corrects the single bit error.

In addition, when the first error bit is detected in the first codeword, the ECC engine 400 may provide the control logic circuit 210 with an error generation signal EGS indicating that the first error bit is detected and the control logic circuit 210 may store a row address and a column address of the first codeword in the error information register 500 as an error address EADDR.

In an example embodiment, the ECC engine 400, instead of the control logic circuit 210, may store the error address EADDR in the error information register 500.

When the first codeword is read again from the sub-page of the target page and the first codeword includes a second error bit different from the first error bit, the ECC engine 400 may recover a second syndrome associated with the second error bit by using the first syndrome SDR1 stored in the error information register 500, and may correct the first error bit and the second error bit by using the first syndrome SDR1 and the second syndrome that is recovered. The ECC engine 400 may sequentially correct the first error bit and the second error bit under control of the control logic circuit 210.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400 and a third control signal to control the error information register 500.

Figure 3:
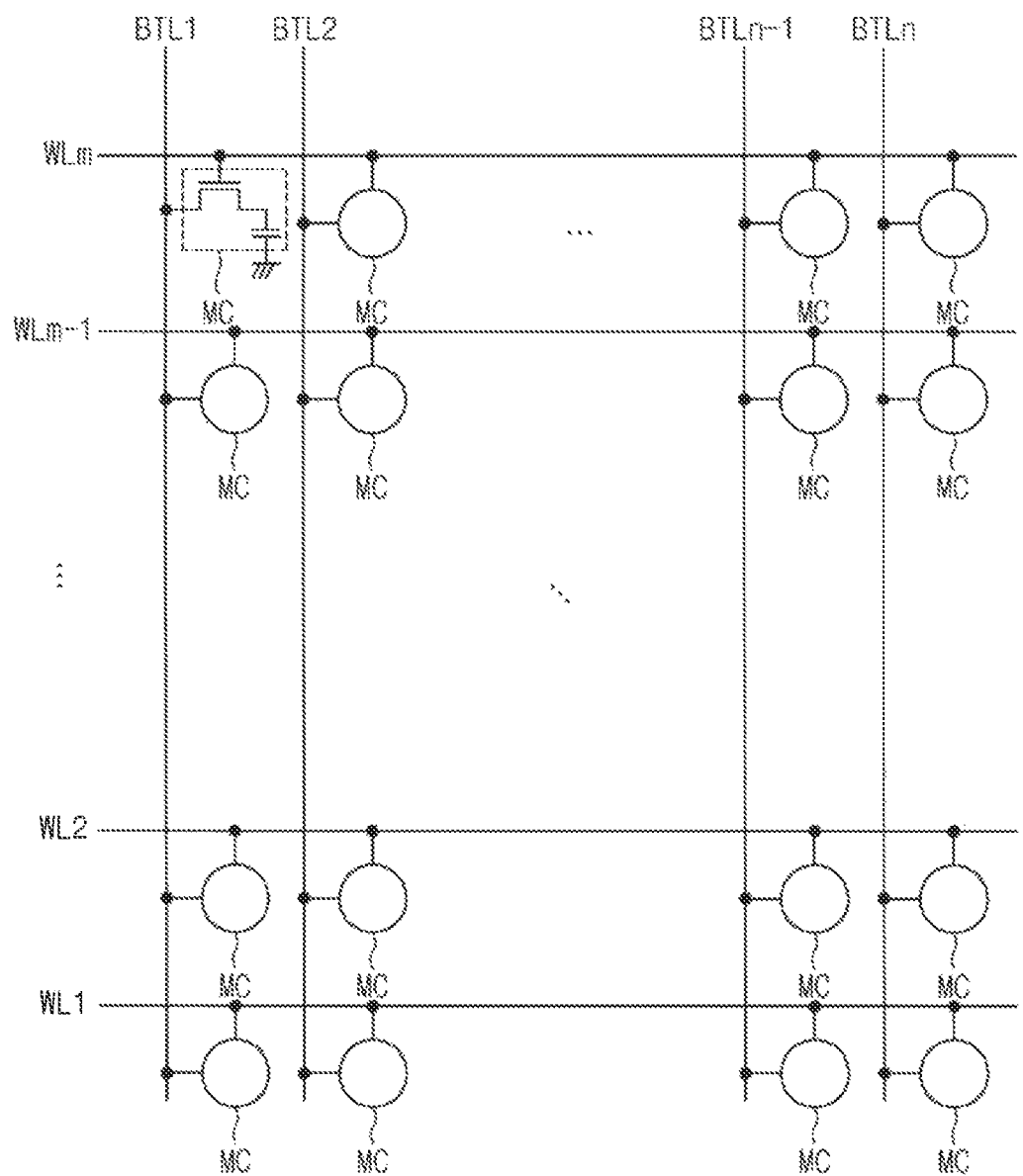
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WLm (m is a natural number greater than two), a plurality of bit-lines BTL1~BTLn (n is a natural number greater than two), and a plurality of memory cells MCs disposed at intersections between the word-lines WL1~WLm and the bit-lines BTL1~BTLn. Each of the memory cells MCs includes a cell transistor coupled to one of the word-lines WL1~WLm and one of the bit-lines BTL1~BTLn, and memory cell MC includes a cell capacitor coupled to the corresponding cell transistor.

Figure 4:
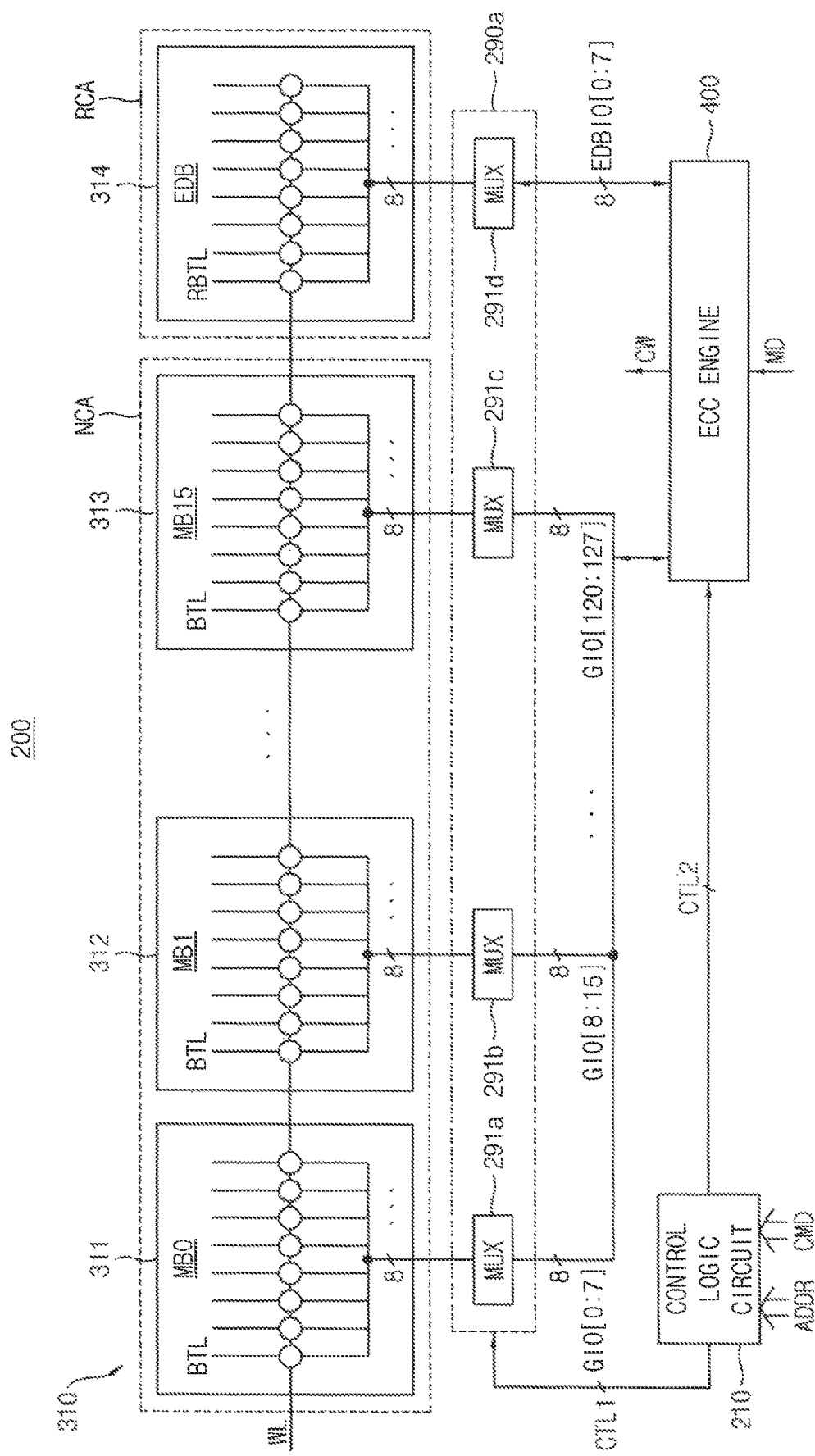
FIG. 4 illustrates a portion of the semiconductor memory device of FIG. 3 during a write operation.

FIG. 4 illustrates a portion of the semiconductor memory device of FIG. 3 during a write operation.

In FIG. 4, the control logic circuit 210, the first bank array 310, the I/O gating circuit 290, and the ECC engine 400 are illustrated.

Referring to FIG. 4, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks, and a quantity of the first memory blocks corresponds to a memory capacity of the semiconductor memory device 200.

The second memory block 314 is for ECC and/or redundancy repair. Because the second memory block 314 is used for ECC, data line repair and block repair to repair 'fail' cells generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC engine 400 may be connected to the switching circuits 291a~291d through first data lines GIO[0:127] and second data lines EDBIO[0:7].

The control logic circuit 210 may receive the command CMD and the address ADDR and may decode the command CMD to generate the first control signal CTL1 for controlling the switching circuits 291a~291d and the second control signal CTL2 for controlling the ECC engine 400.

When the command CMD is a write command, the control logic circuit 210 provides the second control signal CTL2 to the ECC engine 400 and the ECC engine 400 performs ECC encoding on the main data MD to generate parity bits associated with the main data MD and provides the I/O gating circuit 290 with the codeword CW including the main data MD and the parity bit. The control logic circuit 210 provides the first control signal CTL1 to the I/O gating circuit 290 such that the codeword CW is to be stored in a sub-page of the target page in the first bank array 310.

Figure 5:
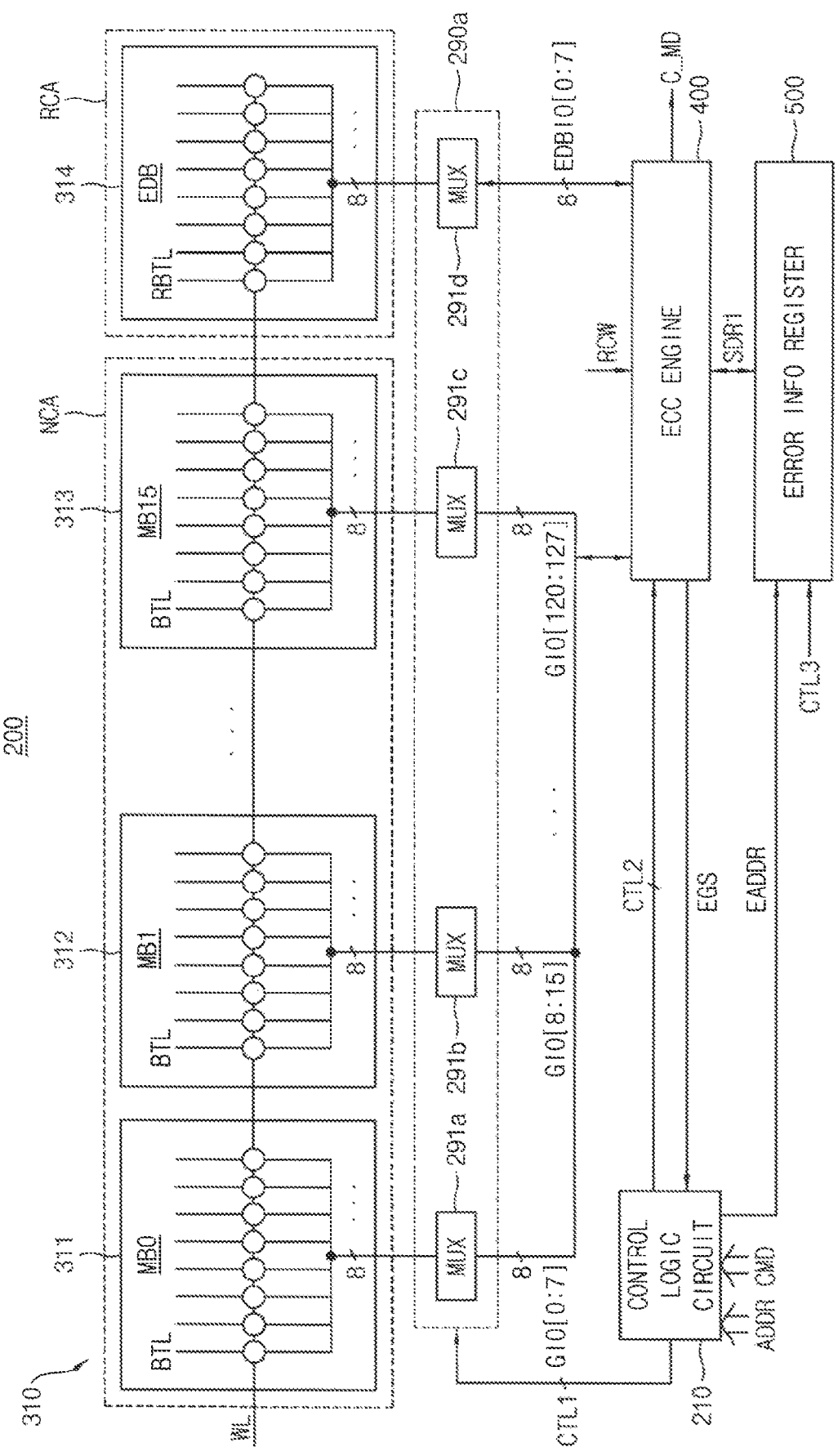
FIG. 5 illustrates a portion of the semiconductor memory device of FIG. 3 in a read operation.

FIG. 5 illustrates a portion of the semiconductor memory device of FIG. 3 in a read operation.

In FIG. 5, the control logic circuit 210, the first bank array 310, the I/O gating circuit 290, the ECC engine 400 and the error information register 500 are illustrated.

Referring to FIG. 5, when the command CMD is a read command to designate a read operation, the control logic circuit 210 provides the first control signal CTL1 to the I/O gating circuit 290 such that a first (read) codeword RCW stored in the sub-page of the target page in the first bank array 310 is provided to the ECC engine 400.

The ECC engine 400 performs ECC decoding on the first codeword RCW to generate a syndrome and stores the first syndrome SDR1 associated with the first error bit in the error information register 500 when the first codeword RCW includes the first error bit. In addition, when the first codeword RCW includes the first error bit, the control logic circuit 210 stores the row address and the column address of the first codeword RCW including the first error bit in the error information register 500 as the error address EADDR.

When the first codeword RCW is read again from the sub-page of the target page and the first codeword RCW includes a second error bit different from the first error bit, the ECC engine 400 recovers a second syndrome associated with the second error bit by using the first syndrome stored in the error information register 500, corrects the first error bit and the second error bit sequentially by using the first syndrome SDR1 and the second syndrome and outputs a corrected main data C_MD.

Figure 6:
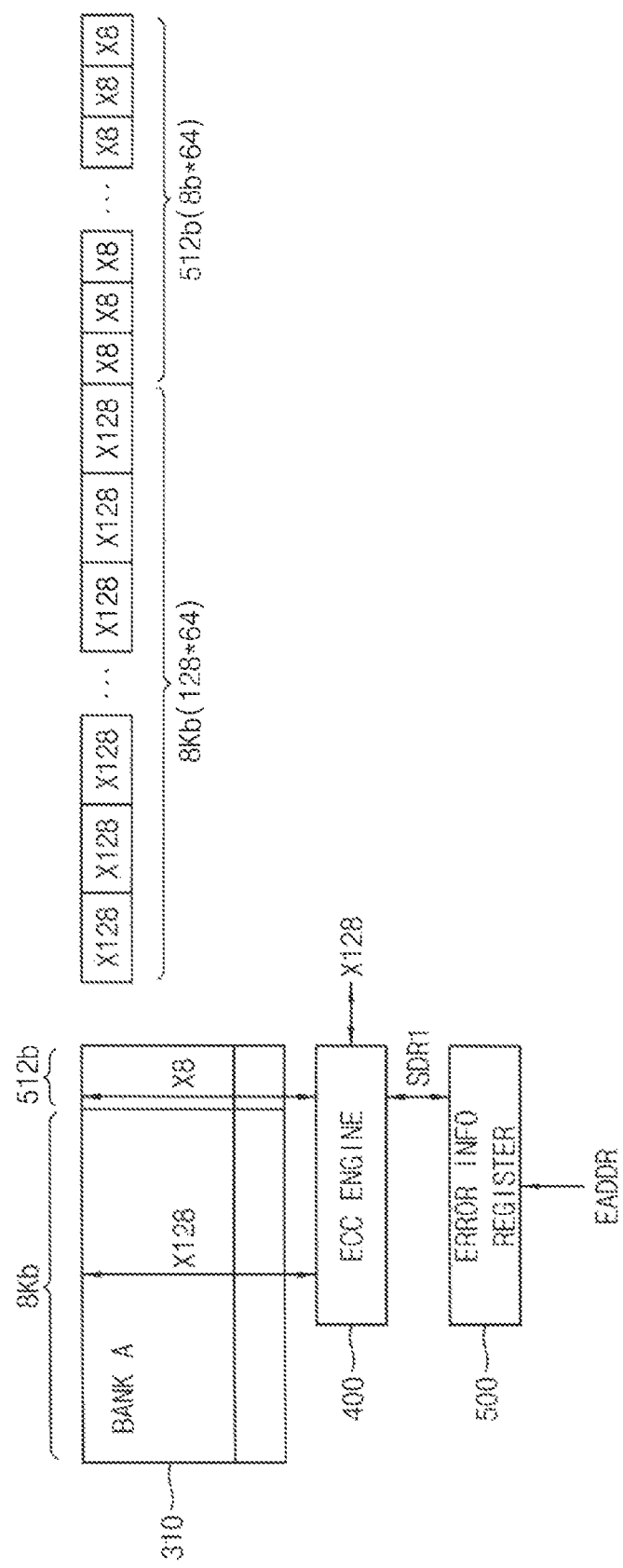
FIG. 6 illustrates a bank array, the ECC engine and the error information register shown in the semiconductor memory device of FIG. 2.

FIG. 6 illustrates a bank array, the ECC engine and the error information register shown in the semiconductor memory device of FIG. 2.

In FIG. 6, the first bank array 310 is illustrated for convenience, however, the details discussed herein related to the first bank array 310 may be applied to the other bank arrays 320~380.

Referring to FIG. 6, each page of the first bank array 310 has a size of 8 kilobits (Kb) and each sub-page of the page has a size of 128 bits (b). Parity bits of 8 b are stored for each sub-page. Data from each sub-page having a size of 128 b and corresponding parity bits having a size of 8 b are sequentially read and provided to the ECC engine 400.

The ECC engine 400 performs ECC decoding on each codeword which is sequentially provided, stores the first syndrome SDR1 associated with the first error bit in the error information register 500 when the first error bit is detected according to a result of the ECC decoding and provides the error generation signal EGS to the control logic circuit 210 such that an address of a codeword including the first error bit is stored in the error information register 500 as the error address EADDR. The error address EADDR may include a row address and a column address of the codeword including the first error bit.

When the codeword including the first error bit is read again, the ECC engine 400 performs ECC decoding on the codeword. When the codeword includes a second error bit different from the first error bit according to a result of the ECC decoding, the ECC engine 400 recovers a second syndrome associated with the second error bit by using the first syndrome SDR1 stored in the error information register 500 and corrects the second error bit by using the second syndrome.

Figure 7:
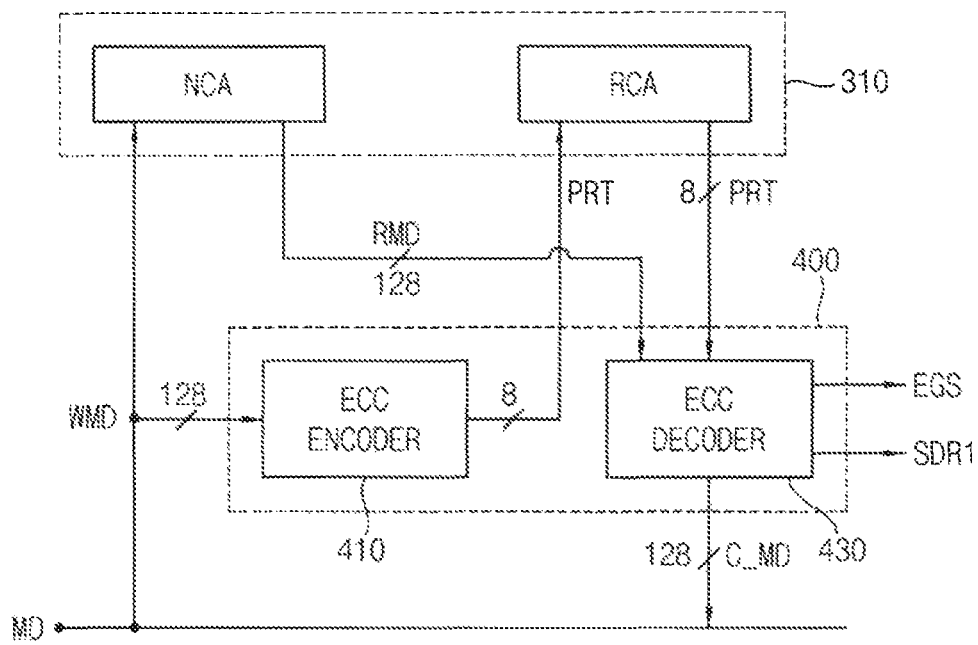
FIG. 7 is a block diagram illustrating an example of the ECC engine in the semiconductor memory device of FIG. 2 according to example embodiments.

FIG. 7 is a block diagram illustrating an example of the ECC engine in the semiconductor memory device of FIG. 2 according to example embodiments.

Referring to FIG. 7, the ECC engine 400 includes an ECC encoder 410 and an ECC decoder 430.

The ECC encoder 410 may generate parity bits PRT associated with a write data WMD to be stored in the normal cell array NCA of the first bank array 310.

The ECC decoder 430 may perform ECC decoding based on the read data RMD and the parity bits PRT read from the first bank array 310. When the read data RMD includes the first error bit as a result of the ECC decoding, the ECC decoder 430 stores the first syndrome SDR1 associated with the first error bit in the error information register 500. When the read data RMD includes a second error bit different from the first error bit after a lapse of time, the ECC decoder 430 recovers a second syndrome associated with the second error bit by using the first syndrome SDR1, corrects the error bits in the read data RMD sequentially by using the first syndrome SDR1 and the second syndrome and outputs a corrected main data C_MD.

Figure 8:
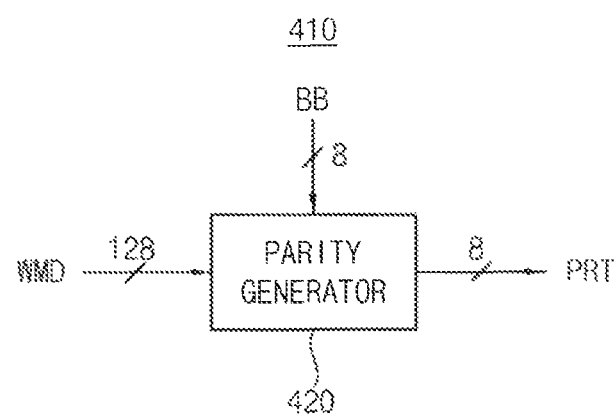
FIG. 8 illustrates an example of the ECC encoder in the ECC engine of FIG. 7 according to example embodiments.

FIG. 8 illustrates an example of the ECC encoder in the ECC engine of FIG. 7 according to example embodiments.

Referring to FIG. 8, the ECC encoder 410 may include a parity generator 420. The parity generator 420 receives 128-bit write data WMD and 8-bit basis data BB and generates the 8-bit parity data PRT by performing, for example, an XOR array operation. The basis bit BB is bits for generating the parity bits PRT with respect to the 128-bit write data WMD and may include b'0000000. The basis bit BB may include other particular bits instead of b'0000000.

Figure 9:
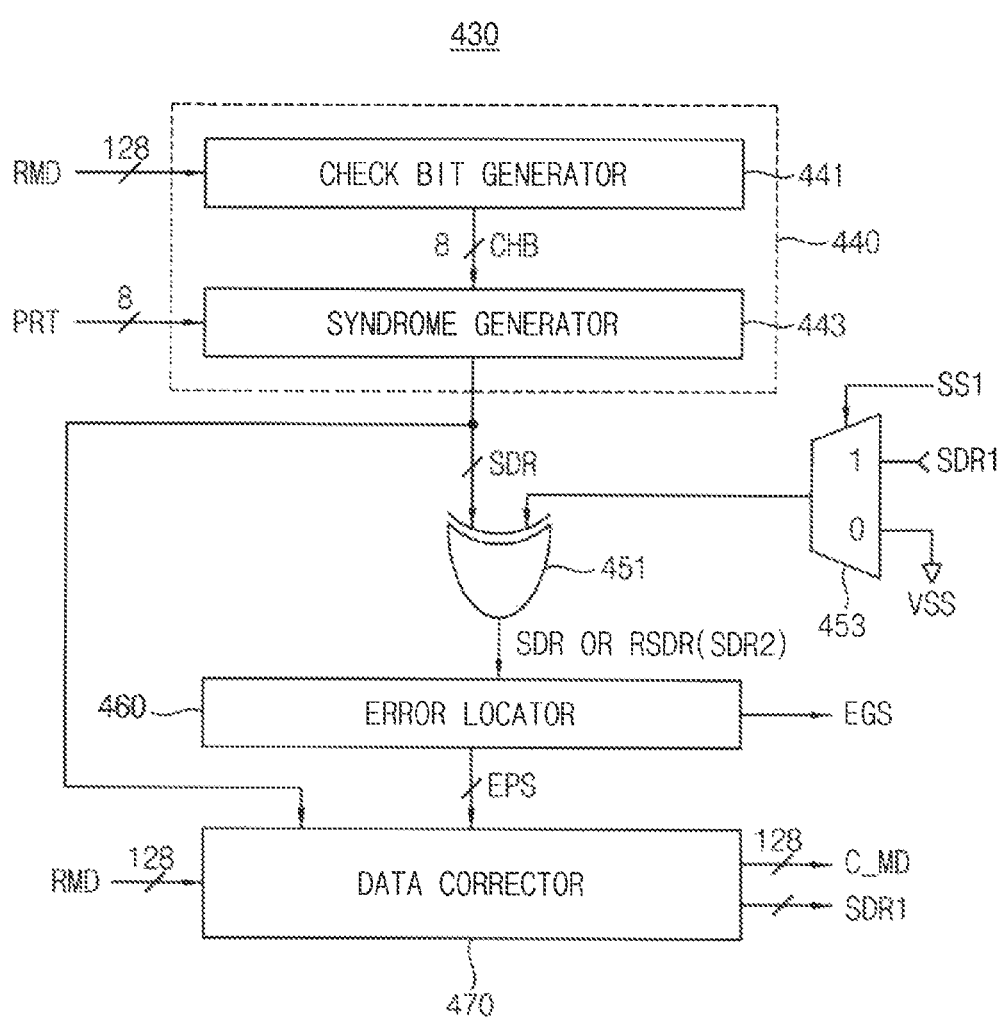
FIG. 9 illustrates an example of the ECC decoder in the ECC engine of FIG. 7 according to example embodiments.

FIG. 9 illustrates an example of the ECC decoder in the ECC engine of FIG. 7 according to example embodiments.

Referring to FIG. 9, the ECC decoder 430 may include a syndrome generation circuit 440, an XOR gate 451, a selection circuit 453, an error locator 460 and a data corrector 470. The syndrome generation circuit 440 may include a check bit generator 441 and a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error position signal EPS to the data corrector 470 when all bits of the syndrome SDR are not 'zero'. In addition, when the read data RMD includes the error bit, the error locator 460 provides the error generation signal EGS to the control logic circuit 210.

The data corrector 470 receives the read data RMD, corrects the error bit in the read data RMD based on the error position signal EPS when the read data RMD includes the error bit and outputs the corrected main data C_MD. In addition, the data corrector 470 receives the syndrome SDR and stores the syndrome SDR in the error information register 500 as the first syndrome SDR1 when the error position signal EPS indicates that the read data RMD includes the error bit.

When the read data RMD is read again from the target page and the read data RMD includes a second error bit different from the first error bit, the error information register 500 provides the first syndrome SDR1 to the selection circuit 453 and the selection circuit 453 selects the first syndrome SDR1 of the first syndrome SDR1 and a ground voltage VSS to output the first syndrome SDR1 in response to a first selection signal SS1 included in the second control signal CTL2. The XOR gate 451 performs an XOR operation on the syndrome SDR and the first syndrome SDR1.

Therefore, the XOR gate 451 may provide the error locator 460 with the syndrome SDR or a recovered syndrome RSDR. The recovered syndrome RSDR may correspond to a second syndrome SDR2. When the selection circuit 453 selects the ground voltage VSS, the XOR gate 451 may provide the syndrome SDR to the error locator 460. When the selection circuit 453 selects the first syndrome SDR1, the XOR gate 451 may provide the recovered syndrome RSDR to the error locator 460.

When the read data RMD includes the first error bit and the second error bit that are generated sequentially, a third error bit which is mis-corrected due to the first error bit and the second error bit may be detected in the read data RMD and a third syndrome associated with the third error bit may be represented by an XOR operation of the firsts syndrome and the second syndrome associated with the second error bit. Therefore, when an XOR operation is performed on the third syndrome and the first syndrome SDR1, an output of the XOR gate 451 corresponds to the second syndrome Therefore, the ECC engine 400 may recover the second syndrome by using the first syndrome SDR1. The data corrector 470 may correct the second error bit in response to the error position signal EPS which is generated based on the second syndrome.

Figure 10:
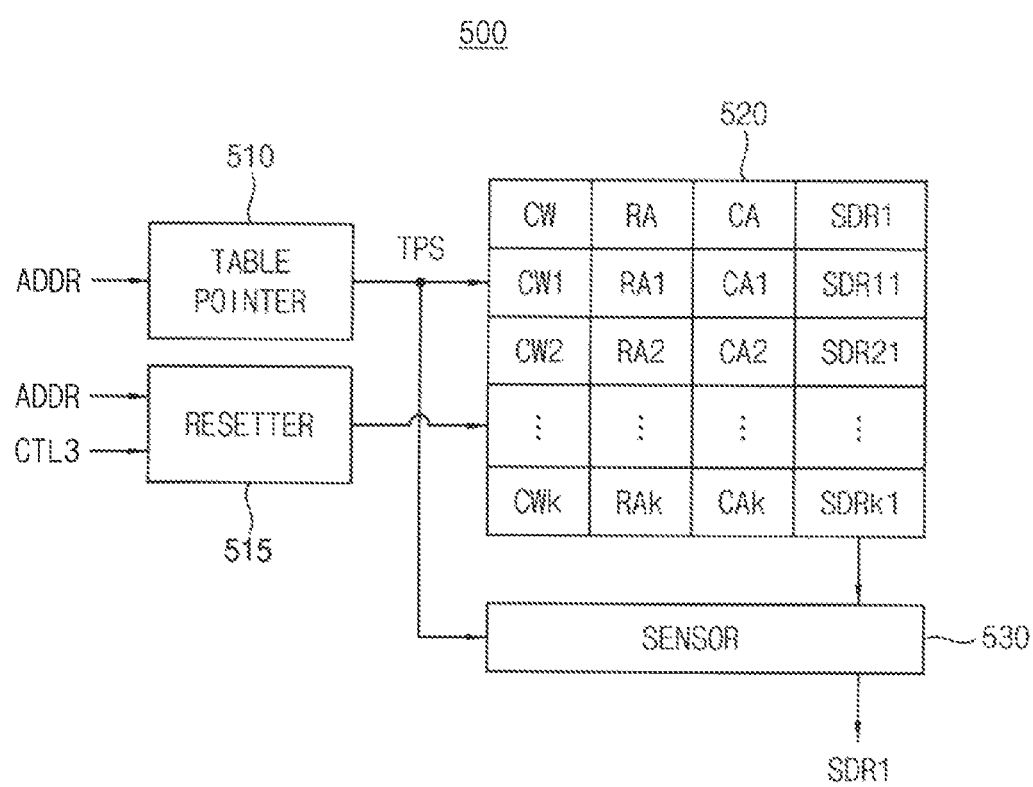
FIG. 10 illustrates an example of the error information register in the semiconductor memory device of FIG. 2 according to example embodiments.

FIG. 10 illustrates an example of the error information register in the semiconductor memory device of FIG. 2 according to example embodiments.

Referring to FIG. 10, the error information register 500 may include a table pointer 510, a resetter 515, an error information table 520 and a sensor 530.

The table pointer 510 may output a table pointing signal TPS to the error information table 520 and the sensor 530 based on a portion of the address (i.e., an access address) ADDR. The table pointer 510 may provide the table pointing signal TPS to a corresponding row of the error information table 520 in response to an address designating one codeword, which is applied when performing ECC decoding.

The error information table 520, in response to the table pointing signal TPS, provides the sensor 530 with the first syndrome SDR1 stored in a row designated by the table pointing signal TPS. The sensor 530 provides the ECC engine 400 with the first syndrome SDR1 from the error information table 520 in response to the table pointing signal TPS.

The resetter 515 may reset an error address and the first syndrome SDR1 of a corresponding codeword associated with the access address ADDR, stored in the error information table 520 in response to the access address ADDR and the third control signal CTL3 when a new data is to be stored in the sub-page of a page designated by the access address ADDR. That is, the resetter 515 may reset contents stored in the row associated with the codeword including the first error bit when the new data is to be stored in the sub-page of the page designated by the access address ADDR.

The error information table 520 may store row addresses RA1~RAk and column addresses CA1~CAk associated with a plurality of codewords CW1~CWk, respectively and may further store first syndromes SDR11~SDR1k associated with each first error bit of the plurality of codewords CW1~CWk. At least some of the row addresses RA1~RAk may be same with respect to each other.

Figure 11:
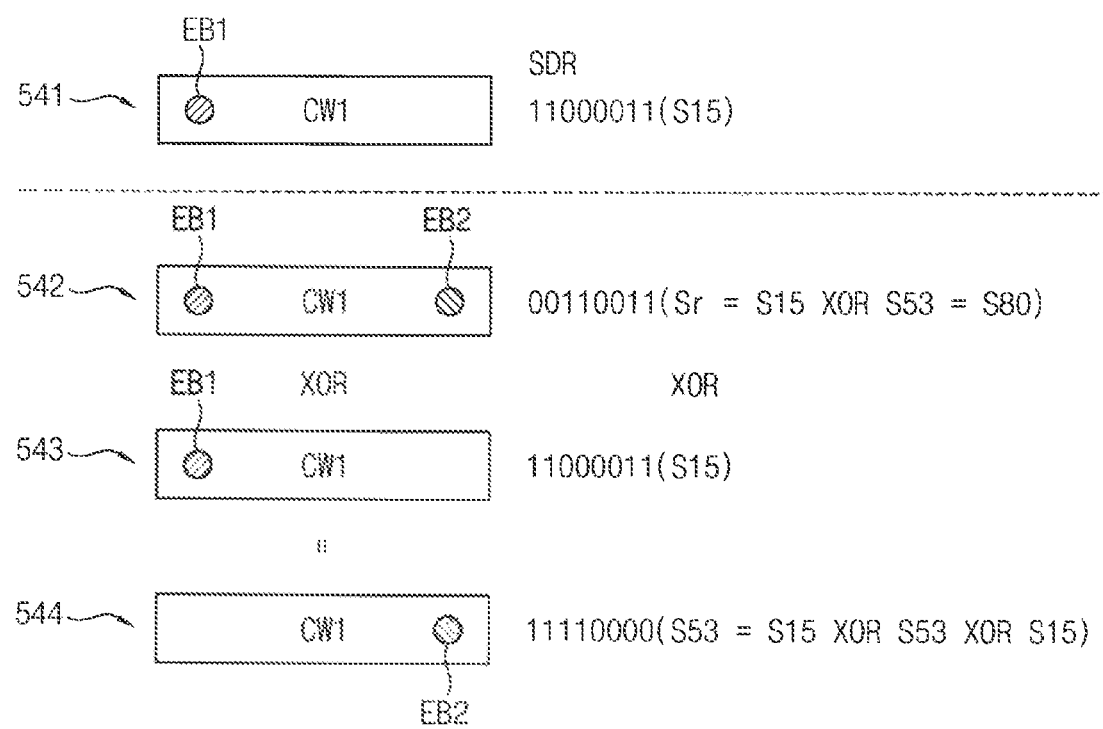
FIG. 11 illustrates an operation of the ECC decoder of FIG. 9 according to example embodiments.

FIG. 11 illustrates an operation of the ECC decoder of FIG. 9 according to example embodiments.

When two error bits are generated in one codeword, a possibility of the two error bits being generated sequentially is much greater than a possibility of the two error bits being generated simultaneously. In addition, it is assumed that the ECC decoder 430 of FIG. 9 is capable of correcting a single error bit.

Referring to FIGS. 9 and 11, it is assumed that the first codeword CW1 includes a first error bit EB1, as indicated by reference numeral 541. The syndrome SDR associated with the first error bit EB1 is a first syndrome S15 which is represented as '11000011'.

As time elapses, the first codeword CW1 may include a second error bit EB2 in addition to the first error bit EB1, as indicated by reference numeral 542. The syndrome SDR associated with the second error bit EB2 is a second syndrome S53.

When the ECC decoder 430 performs ECC decoding on the first codeword CW1 which includes the first error bit EB1 and the second error bit EB2, the first codeword CW1 includes a third error bit which is mis-corrected due to the first error bit EB1 and the second error bit EB2 because the first codeword CW1 includes error bits that exceeds error correction capability of the ECC engine 400. The syndrome SDR associated with the third error bit is a third syndrome S80 (i.e., Sr) which is represented as '00110011'.

The third syndrome S80 may be represented as a result of XOR operation on the first syndrome S15 and the second syndrome S53, as indicated by reference numeral 542. As indicated by reference numeral 543, when an XOR operation is performed on the first syndrome S15 stored in the error information register 500 and the third syndrome S80, the second syndrome S53, which is represented as '11110000', is recovered as indicated by reference numeral 544 and the second error bit EB2 is recovered. Therefore, the ECC engine 400 may correct the second error bit EB2 by using the second syndrome S53 that is recovered.

Figure 12:
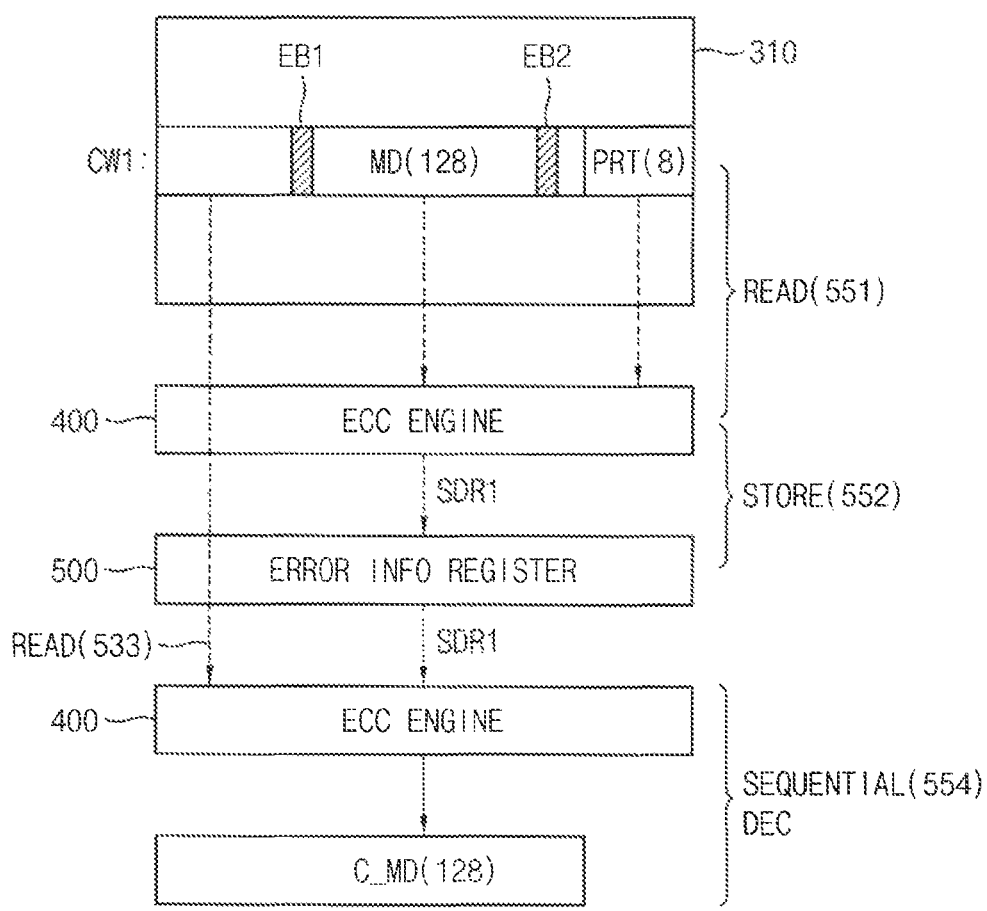
FIG. 12 illustrates ECC decoding performed in the semiconductor memory device in FIG. 5.

FIG. 12 illustrates that ECC decoding is performed in the semiconductor memory device in FIG. 5.

Referring to FIGS. 5 through 7 and 9 through 12, when the command CMD is a read command, the first code word CW1, including a 128-bit main data MD and 8-bit parity bits PRT, is read from a sub-page of a page in the first bank array 310, and the first codeword CW1 is provided to the ECC decoder 430, as indicated by reference numeral 551. The first codeword CW1 may include a first error bit EB1. The ECC engine 400 performs ECC decoding on the first codeword CW1, and stores the first syndrome SDR1 associated with the first error bit EB1 in the error information register 500, as indicated by reference numeral 552.

As time elapses, the first codeword CW1 stored in the first bank array 310 includes a second error bit EB2 different from the first error bit EB1, the first codeword CW1 is read again from the sub-page of the page in the first bank array 310 first codeword CW1, and is provided to the ECC engine 400, as indicated by reference numeral 553. When the ECC engine 400 performs ECC decoding on the first codeword CW1 including the first error bit EB1 and the second error bit EB2, the second error bit EB2 is detected.

The ECC engine 400 recovers a second syndrome associated with the second error bit EB2 by using the first syndrome SDR1 stored in the error information register 500, corrects the first error bit EB1 and the second error bit EB2 by using the first syndrome SDR1 and the second syndrome, and outputs the corrected main data C_MD, as indicated by reference numeral 554.

Figure 13:
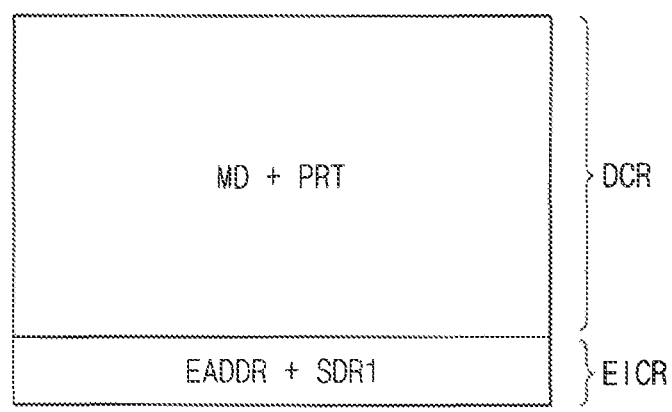
FIG. 13 illustrates an example of the first bank array in the semiconductor memory device of FIG. 2 according to example embodiments.

FIG. 13 illustrates an example of the first bank array in the semiconductor memory device of FIG. 2 according to example embodiments.

Referring to FIG. 13, a first bank array 310a may include a data cell region DCR and an error information cell region EICR.

The data cell region DCR may store the main data MD and the parity bits PRT, and the error information cell region EICR may store the error address EADDR and the first syndrome SDR1.

Each of the second through eighth bank arrays 320~380 may have substantially same configuration as the first bank array 310a of FIG. 13. Therefore, the semiconductor memory device 200 may implement the error information register 500 by using a portion of the memory cell array 300.

As mentioned above, the semiconductor memory device 200 employs the ECC engine 400 capable of correcting a single error bit and the semiconductor memory device 200 stores a first syndrome associated with a first error bit in the error information register when the first error bit is detected in one codeword. When the one codeword is read again from the memory cell array and the one codeword includes a second error bit different from the first error bit, the ECC engine 400 may recover a second syndrome associated with the second error bit by using the first syndrome stored in the error information register and may correct the second error bit by using the second syndrome that is recovered. Therefore, even when the ECC engine 400 is capable of correcting a single error bit, the ECC engine 400 may sequentially correct the first error bit and the second error bit without increasing overhead for performing ECC decoding, and thus the semiconductor memory device 200 may enhance performance.

Figure 14:
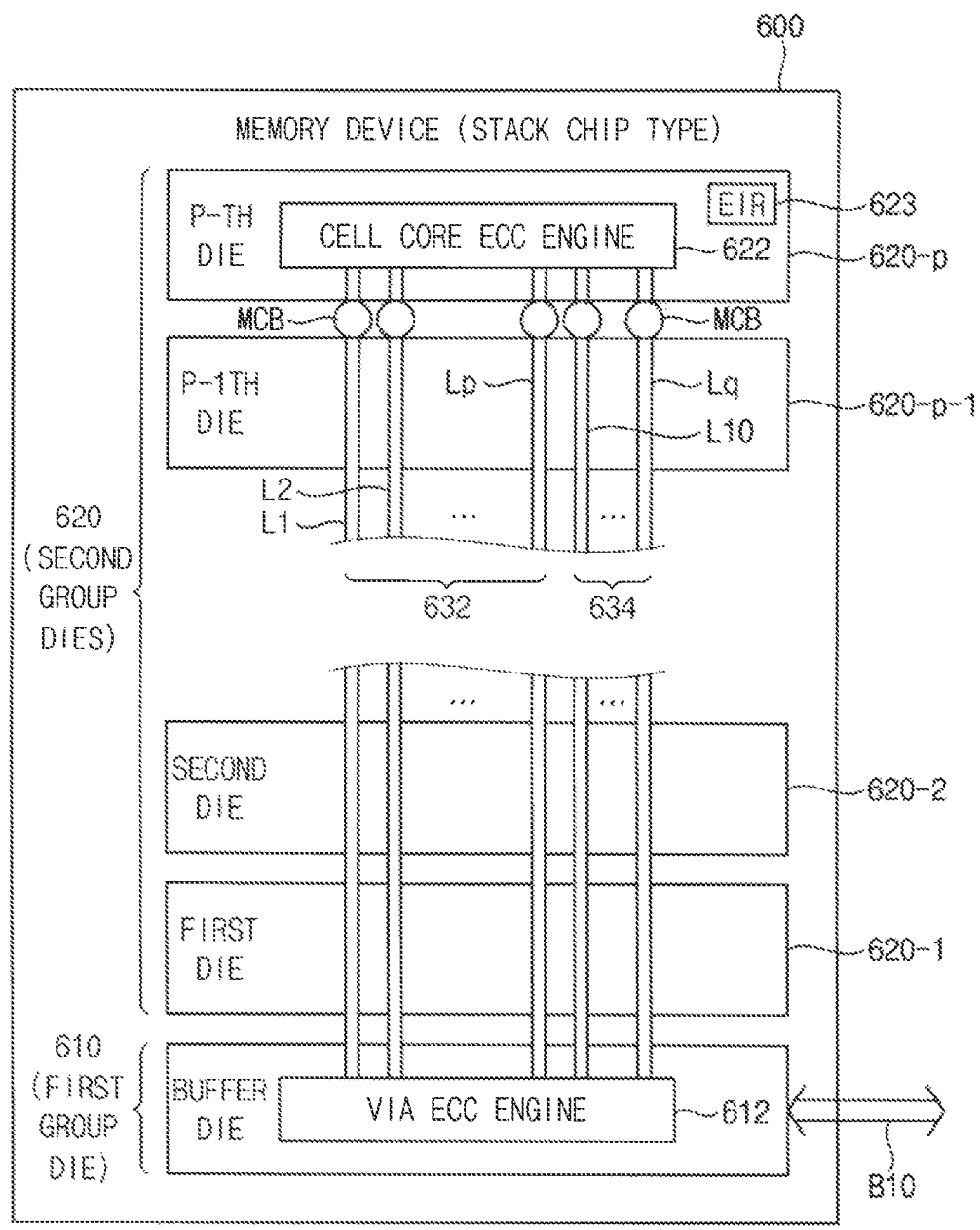
FIG. 14 is a block diagram illustrating a semiconductor memory device according to example embodiments.

FIG. 14 is a block diagram illustrating a semiconductor memory device according to example embodiments.

Referring to FIG. 14, a semiconductor memory device 600 may include first group die 610 and second group dies 620 providing a soft error analyzing and correcting function in a stacked chip structure.

The first group die 610 may include at least one buffer die. The second group dies 620 may include a plurality of memory dies 620-1 to 620-p which is stacked on the first group die 610 and conveys data through a plurality of through silicon via (TSV) lines.

At least one of the memory dies 620-1 to 620-p may include a first type ECC engine 622 which generates transmission parity bits (i.e., transmission parity data) based on transmission data to be sent to the first group die 610 and an error information register 623. The first type ECC engine 622 may be referred to as 'cell core ECC engine'. The first type ECC engine 622 may employ the ECC engine of FIG. 7.

The buffer die 610 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called 'through electrodes'.

As mentioned above, the first type ECC engine 622 may store a first syndrome associated with a first error bit in the error information register 623 when the first error bit and a second error bit are generated sequentially in one codeword, and may recover a second syndrome associated with the second error bit by using the first syndrome stored in the error information register 623.

The first type ECC engine 622 may perform error correction on data which is outputted from the memory die 620-p before the transmission data is sent.

A transmission error which occurs at the transmission data may be due to noise which occurs at the TSV lines. Because a data fail due to the noise occurring at the TSV lines may be distinguishable from a data fail due to a false operation of the memory die, the data fail due to the may be regarded as a soft data fail (or a soft error). The soft data fail may be generated due to transmission fail on a transmission path, and may be detected and remedied by an ECC operation.

For example, when the transmission data is 128-bit data, the transmission parity bits may be set to 8 bits. However, example embodiments are not limited thereto. The number of transmission parity bits increases or decreases.

With the above description, a TSV line group 632 which is formed at one memory die 620-p may include 64 TSV lines L1 to Lp, and a parity TSV line group 634 may include 8 TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the host through the data bus B10.

The first type ECC engine 622, denoted as the cell core ECC engine, may output transmission parity bits as well as the transmission data through the parity TSV line group 634 and the data TSV line group 632 respectively. The outputted transmission data may be data which is error-corrected by the first type ECC engine 622.

The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error on the transmission data using the transmission parity bits. When the transmission error is uncorrectable, the second type ECC engine 612 may output information indicating occurrence of an uncorrectable data error.

When an error is detected from read data in a high bandwidth memory (HBM) or the stacked memory structure, the error is an error occurring due to noise while data is transmitted through the TSV.

According to example embodiments, as illustrated in FIG. 14, the cell core ECC engine 622 may be included in the memory die, the via ECC engine 612 may be included in the buffer die. Accordingly, it may be possible to detect and correct a soft data fail. The soft data fail may include a transmission error which is generated due to noise when data is transmitted through TSV lines.

Figure 15:
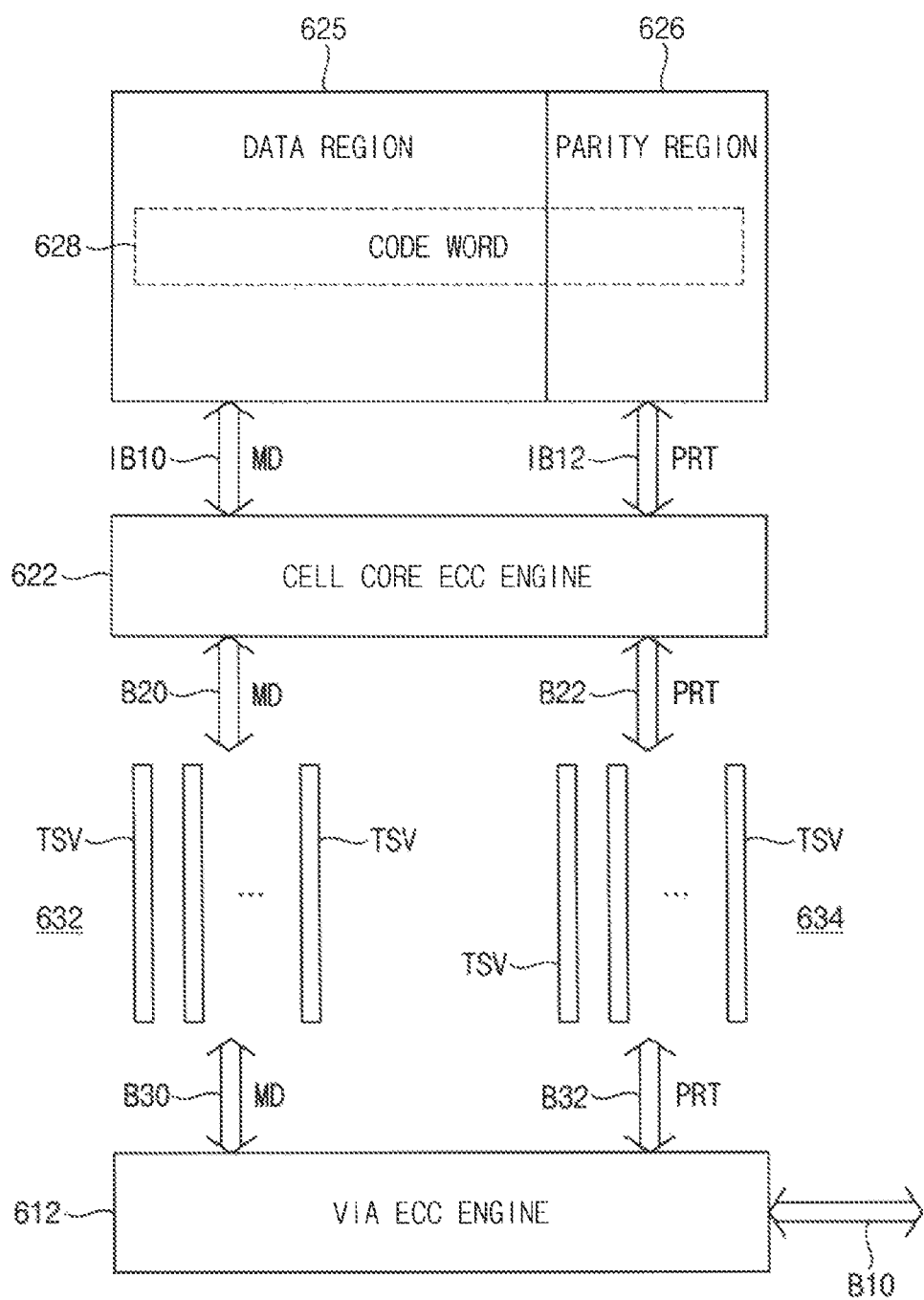
FIG. 15 is a diagram schematically illustrating connections between ECC engines in FIG. 14.

FIG. 15 is a diagram schematically illustrating connections between ECC engines in FIG. 14.

Referring to FIG. 15, the cell core ECC engine 622 and the via ECC engine 612 may be connected through the data TSV line group 632 and the parity TSV line group 634.

More particularly, one memory die may include a memory cell array, and the memory cell array may include a data region 625 storing the main data MD and a parity region 626 storing the parity bits PRT.

In the case of reading data, a code word 628 may include main data MD from the data region 625 and the parity bits PRT from the parity region 626. The cell core ECC engine 622 may receive the main data MD through an internal data bus IB10 and the parity bits PRT through an internal parity bus IB12. The cell core ECC engine 622 may check a read error on the main data MD using the parity bits PRT and may perform error correction based on the checking result.

The cell core ECC engine 622 may output the error-corrected data as transmission data through a data bus B20 and may output transmission parity data through the parity bus B22. Here, the transmission parity data may be the same information as the parity bits PRT.

The via ECC engine 612 may receive the transmission data through a data bus B30 and the transmission parity data through a parity bus B32. The data bus B20 and the data bus B30 may be implemented with the data TSV line group 632 described with reference to FIG. 14. The parity bus B22 and the parity bus B32 may be implemented with the parity TSV line group 634 described with reference to FIG. 14.

The via ECC engine 612 may perform error checking on the transmission data received through the data TSV line group 632, based on the transmission parity data received through the parity TSV line group 634. When a transmission error is detected through the error checking, the second type ECC engine 612 may correct the transmission error on the transmission data, based on the transmission parity data. For example, in the case where the number of correctable data bits is one, error correction may be impossible when the transmission error which includes two or more error bits occurs. In this case, the second type ECC engine 612 may output information indicating occurrence of a data error to the data bus B10.

In an example embodiment, the via ECC engine 612 may employ the ECC engine 400 of FIG. 7.

Figure 16:
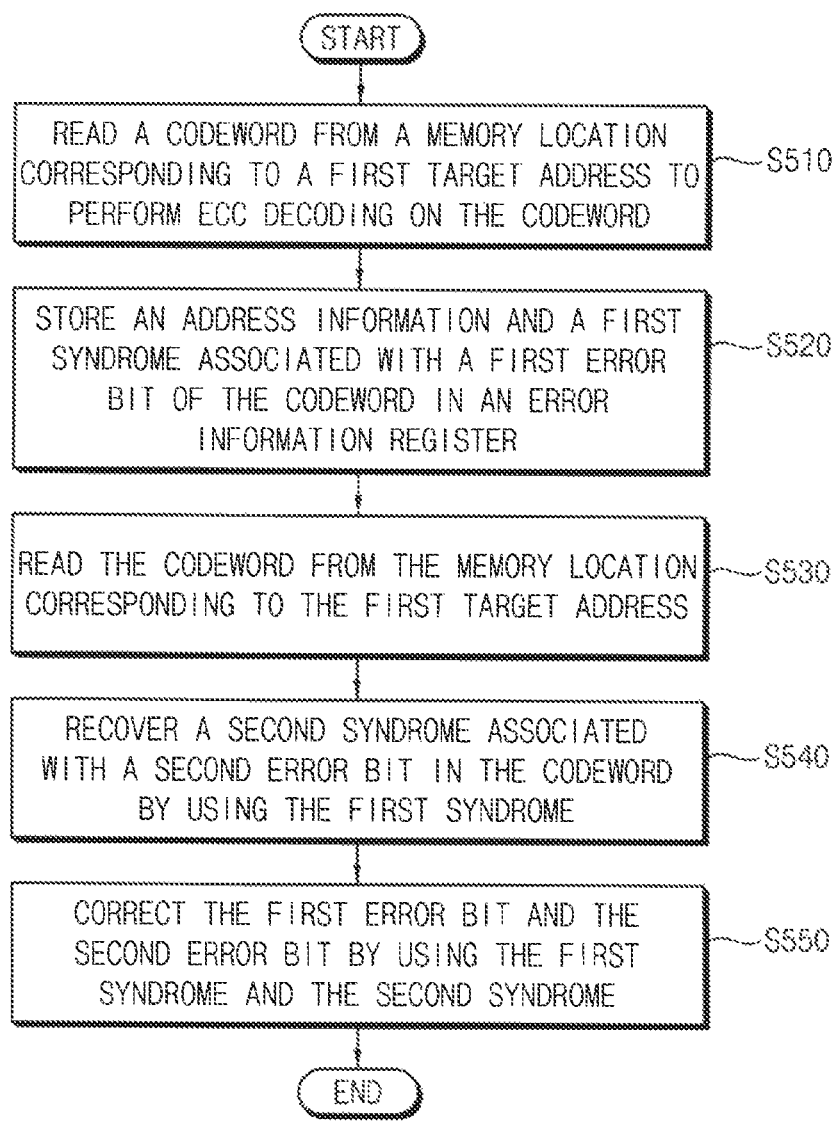
FIG. 16 is a flow chart illustrating a method of operating a semiconductor memory device according to example embodiments.

FIG. 16 is a flow chart illustrating a method of operating a semiconductor memory device according to example embodiments.

Referring to FIGS. 1 through 16, in a method of operating a semiconductor memory device 200 including a memory cell array 300 that has a plurality of dynamic memory cells, the ECC engine 400 performs ECC decoding on a first codeword CW1 read from a memory location of the memory cell array 300 (S510), and the first codeword CW1 corresponds to an access address ADDR received from the memory controller 100.

When a first error bit EB1 is detected in the first codeword CW1, the ECC engine 400 stores a first syndrome SDR1 and an error address EADDR associated with the first error bit EB1 in the error information register 500 (S520).

When a second error bit EB2 different from the first error bit EB1 is detected in the first codeword CW1 read again from the memory location of the memory cell array 300, the ECC engine 400 recovers a second syndrome SDR2 associated with the second error bit EB2 by using the first syndrome SDR1 stored in the error information register 500 (S530).

The ECC engine 400 corrects the first error bit EB1 and the second error bit EB2 by using the first syndrome SDR1 and the second syndrome (S540). In an example embodiment, the ECC engine 400 may correct the first error bit EB1 and the second error bit EB2 sequentially by using the first syndrome SDR1 and the second syndrome.

That is, the ECC engine 400 may separate the first error bit EB1 and the second error bit EB2 generated in the first codeword CW1 and may sequentially correct the first error bit EB1 and the second error bit EB2.

Figure 17:
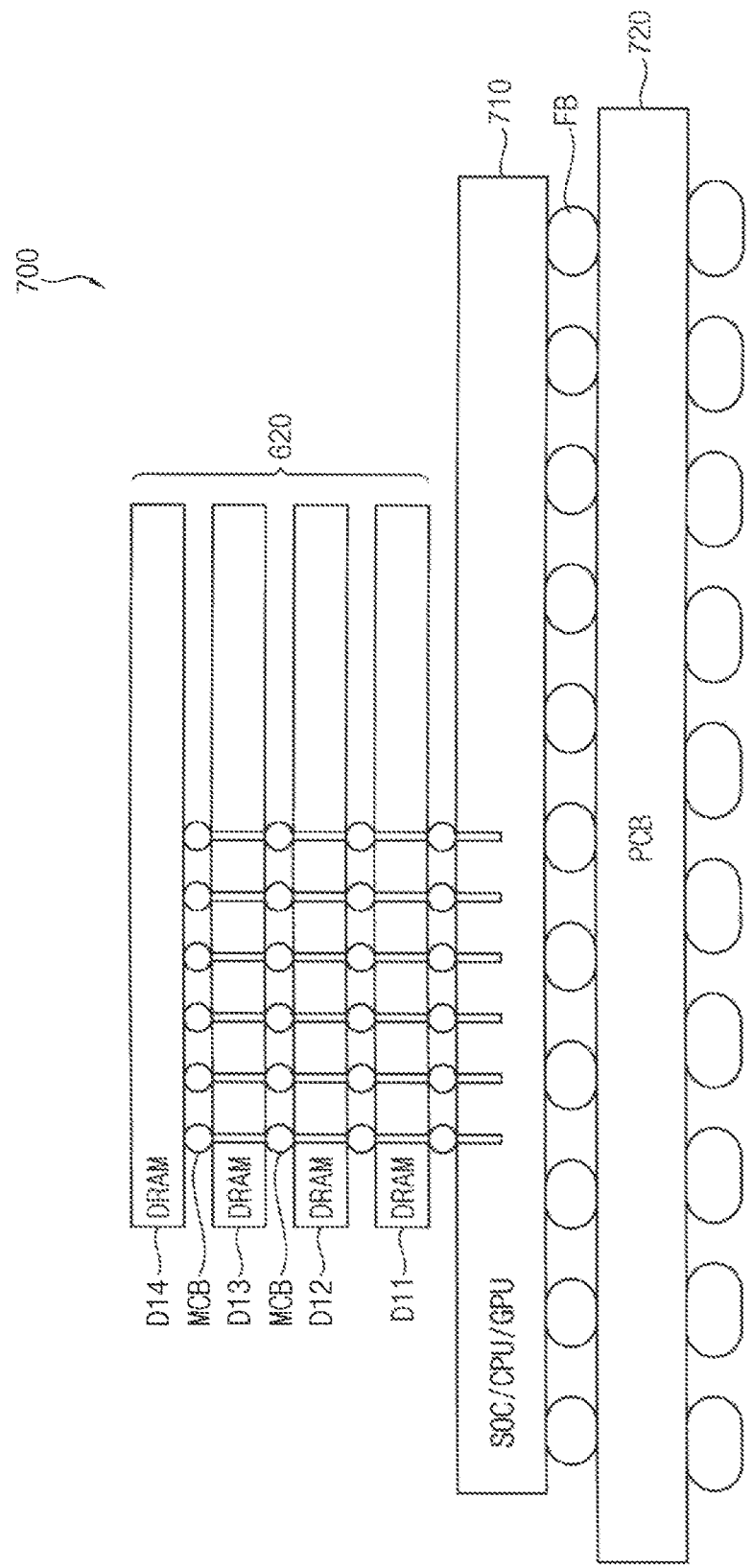
FIG. 17 is a cross-sectional view of a 3D chip structure employing the semiconductor memory device of FIG. 14 according to example embodiments.

FIG. 17 is a cross-sectional view of a 3D chip structure employing the semiconductor memory device of FIG. 14 according to example embodiments.

FIG. 17 shows a 3D chip structure 700 in which a host and a HBM are directly connected without an interposing layer.

Referring to FIG. 17, a host die 710, such as a system-on-chip (SoC), a central processing unit (CPU), or a graphic processing unit (GPU), may be disposed on a printed circuit board (PCB) 720 using flip chip bumps FB. Memory dies D11 to D14 may be stacked on the host die 720 to implement a HBM structure. In FIG. 17, the buffer die 610 or a logic die of FIG. 14 is omitted. However, the buffer die 610 or the logic die may be disposed between the memory die D11 and the host die 720. To implement the HBM structure 620, TSV lines may be formed at the memory dies D11 and D14. The TSV lines may be electrically connected with micro bumps MCB placed between memory dies.

Figure 18:
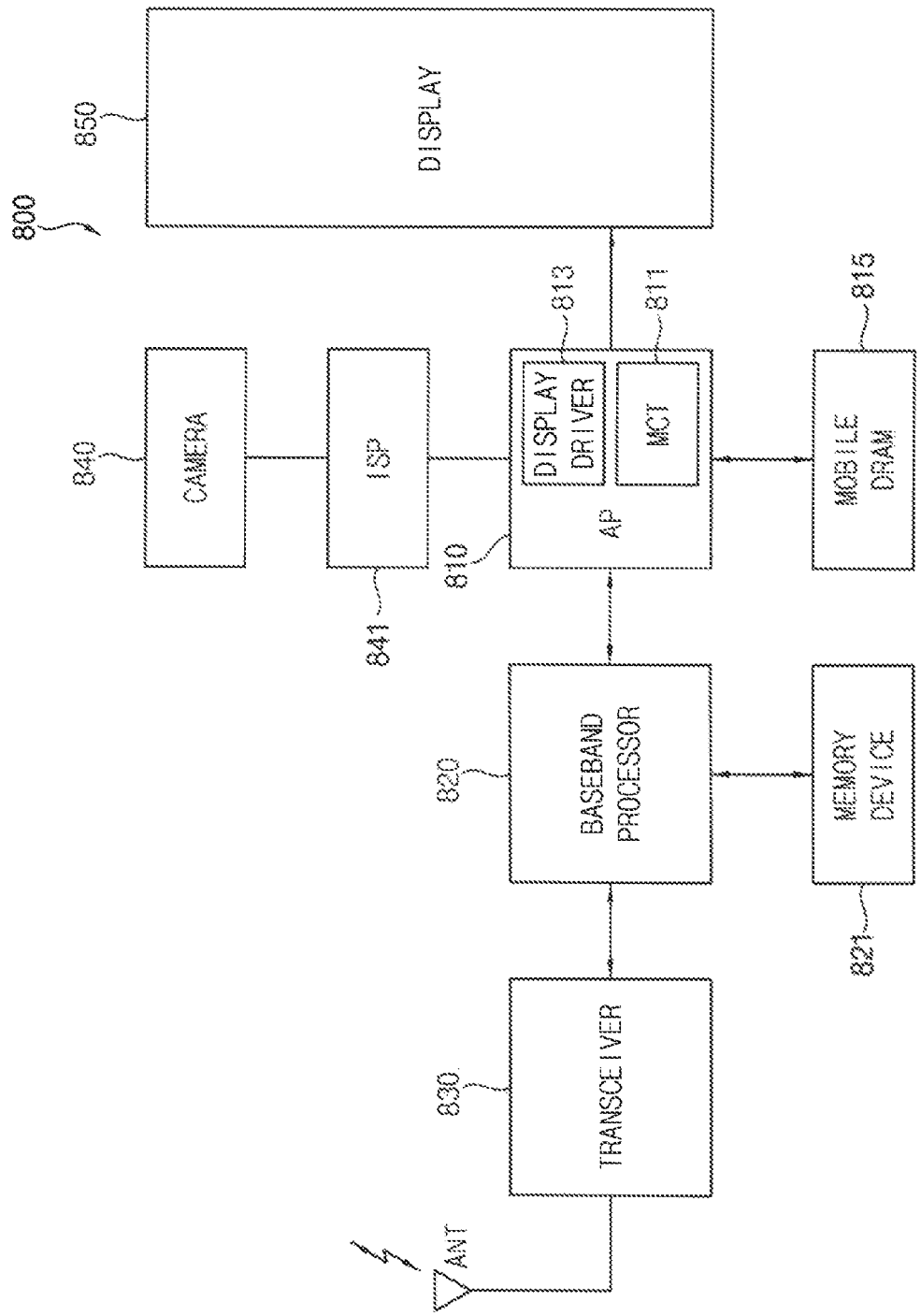
FIG. 18 is a block diagram illustrating a smart phone employing the semiconductor memory device according to example embodiments.

FIG. 18 is a block diagram illustrating a smart phone employing the semiconductor memory device according to example embodiments.

Referring to FIG. 18, a smart phone 800 may be implemented with a mobile computing device. An application processor (AP), for example, a mobile application processor 810 may control components 815, 820, 841, and 850 of the smart phone 800.

The mobile application processor 810 may use a mobile DRAM 815 as a work memory. A memory device 821 may be used as a work and program memory of a baseband processor 820.

In FIG. 18, the mobile DRAM 815 may be implemented with the semiconductor memory device 200 of FIG. 2. A memory controller (MCT) 811 included in the application processor 810 may control an access to the mobile DRAM 815. A display driver 813 included in the application processor 810 may control a display 850.

The baseband processor 820 may allow data to be exchanged between a wireless transceiver 830 and the application processor 810. Data processed by the baseband processor 820 may be sent to the application processor 810 or may be stored at the memory device 821. The memory device 821 may be implemented with a volatile memory or a nonvolatile memory.

Wireless data received through an antenna ANT may be transmitted to the baseband processor 820 by way of the wireless transceiver 830, and data outputted from the baseband processor 820 may be converted into wireless data by the wireless transceiver 830. The converted wireless data may be outputted through the antenna ANT.

The image signal processor 841 may process a signal from a camera (or an image sensor) 840 and may transfer the processed data to the application processor 810.

As mentioned above, according to example embodiments, the semiconductor memory device employs the ECC engine and the ECC engine stores a first syndrome associated with a first error bit in the error information register when the first error bit is detected in one codeword. When the one codeword is read again from the memory cell array and the one codeword includes a second error bit different from the first error bit, the ECC engine may recover a second syndrome associated with the second error bit by using the first syndrome stored in the error information register and may correct the second error bit by using the second syndrome that is recovered. Therefore, even when the ECC engine is capable of correcting a single error bit, the ECC engine may sequentially correct the first error bit and the second error bit without increasing overhead for performing ECC decoding, and thus semiconductor memory device performance may be enhanced.

Aspects of the present disclosure may be applied to systems using semiconductor memory devices that employ an ECC engine.

As is traditional in the field, example embodiments are, in part, described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a memory cell array including a plurality of dynamic memory cells;
   an error correction code engine (an ECC engine);
   an input/output gating circuit (an I/O gating circuit) connected between the ECC engine and the memory cell array;
   an error information register configured to store an error address and a first syndrome, the error address and the first syndrome being associated with a first error bit in a first codeword stored in a first page of the memory cell array; and
   a control logic circuit configured to control the ECC engine, the I/O gating circuit and the error information register based on an address and a command from an external memory controller,
   wherein the control logic circuit is further configured to, based on the first codeword being read again and including a second error bit which is different from the first error bit, recover a second syndrome associated with the second error bit by using the first syndrome stored in the error information register and sequentially correct the first error bit and the second error bit.

2. The semiconductor memory device of claim 1, wherein the ECC engine is further configured to sequentially correct the first error bit and the second error bit based on the first syndrome and the second syndrome.

3. The semiconductor memory device of claim 2, wherein the control logic circuit is further configured to control the ECC engine to recover the second syndrome by performing an XOR operation based on the first syndrome and a third syndrome, and
   wherein the third syndrome is associated with a third error bit which is mis-corrected due to the first error bit and the second error bit.

4. The semiconductor memory device of claim 1, wherein the ECC engine is further configured to correct a single error bit.

5. The semiconductor memory device of claim 1, wherein the error information register is further configured to store a row address and a column address associated with the first codeword.

6. The semiconductor memory device of claim 5, wherein the control logic circuit is further configured to reset a row of the error information register in which the error address and the first syndrome associated with the first error bit are stored based on a new write data being stored in the first page.

7. The semiconductor memory device of claim 1, wherein the error information register comprises:
   an error information table configured to store a row address, a column address and the first syndrome, in association with the first codeword;
   a table pointer configured to provide a table pointing signal corresponding to the error information table based on the address; and
   a resetter configured to reset contents stored in the error information table based on a control signal being received from the control logic circuit.

8. The semiconductor memory device of claim 1, wherein the ECC engine includes:
   an ECC encoder configured to perform ECC encoding on a main data from the external memory controller to generate a parity bits to be stored in the first page; and
   an ECC decoder configured to perform ECC decoding on the main data in the first codeword as read from the first page by using the parity bits to generate the first syndrome, and recover the second syndrome by using the first syndrome.

9. The semiconductor memory device of claim 8, wherein the ECC decoder includes:
   a syndrome generation circuit configured to generate a syndrome by using the first codeword as read from the first page;

an error locator configured to generate an error position signal indicating a position of the first error bit or the second error bit based on the syndrome or a recovered syndrome;

a data corrector configured to correct the first error bit or the second error bit based on the error position signal to output a corrected main data;

a selection circuit configured to select one from among the first syndrome and a ground voltage as a selected output based on a selection signal; and an XOR gate to perform an XOR operation on the syndrome and the selected output to provide the error locator with the syndrome or the recovered syndrome.

10. The semiconductor memory device of claim 9, wherein the error locator is further configured to provide an error generation signal to the control logic circuit based on the syndrome including the first error bit, and wherein the control logic circuit is further configured to store a row address and a column address of the first codeword associated with the first error bit in the error information register as the error address.

11. The semiconductor memory device of claim 9, wherein the data corrector is further configured to store the syndrome in the error information register as the first syndrome when the syndrome includes the first error bit.

12. The semiconductor memory device of claim 9, wherein the syndrome generation circuit comprises:

a check bit generator configured to generate check bits based on the main data in the first codeword as read from the first page; and a syndrome generator configured to generate the syndrome by comparing corresponding bits of the parity bits in the first codeword and the check bits.

13. The semiconductor memory device of claim 1, wherein the control logic circuit is further configured to store the error address and the first syndrome in a portion of the memory cell array.

14. The semiconductor memory device of claim 1, comprising:

first group dies including at least one buffer die; and second group dies including a plurality of memory dies, the plurality of memory dies stacked on the first group dies and conveying data through a plurality of through silicon via lines (a plurality of TSV lines), wherein at least one of the plurality of memory dies includes the memory cell array and the ECC engine, and the ECC engine is further configured to generate transmission parity bits using a transmission data to be sent to the first group dies, and wherein the at least one buffer die includes a via-ECC engine configured to correct a transmission error using the transmission parity bits when the transmission error is detected from the transmission data received through the plurality of TSV lines.

15. The semiconductor memory device of claim 14, wherein the semiconductor memory device is a high-bandwidth memory (HBM).

16. The semiconductor memory device of claim 14, wherein the ECC engine is further configured to correct error output from the plurality of memory dies before the transmission data is sent to the at least one buffer die.

17. A memory system comprising:
at least one semiconductor memory device; and
a memory controller configured to control the at least one semiconductor memory device, wherein the at least one semiconductor memory device includes:

a memory cell array including a plurality of dynamic memory cells;

an error correction code engine (an ECC engine);

an input/output gating circuit (an I/O gating circuit) connected between the ECC engine and the memory cell array;

an error information register configured to store an error address and a first syndrome, the error address and the first syndrome being associated with a first error bit in a first codeword stored in a first page of the memory cell array; and a control logic circuit configured to control the ECC engine, the I/O gating circuit and the error information register based on an address and a command from the memory controller, wherein the control logic circuit is further configured to control, when the first codeword is read again from the first page and includes a second error bit different from the first error bit, the ECC engine to recover a second syndrome associated with the second error bit by using the first syndrome stored in the error information register and sequentially correct the first error bit and the second error bit.

18. The memory system of claim 17, wherein the ECC engine is further configured to sequentially correct the first error bit and the second error bit based on the first syndrome and the second syndrome as recovered.

19. A method of operating a semiconductor memory device including a memory cell array, the method of operating the semiconductor memory device comprising:

performing, in an error correction code engine (an ECC engine), ECC decoding on a first codeword as read from a memory location of the memory cell array, the first codeword corresponding to an access address;

storing an error address and a first syndrome in an error information register based on a first error bit being detected in the first codeword, the error address and the first syndrome being associated with the first error bit;

recovering, in the ECC engine, a second syndrome associated with a second error bit by using the first syndrome stored in the error information register based on the first codeword being read again from the memory location and including the second error bit which is different from the first error bit; and correcting, in the ECC engine, the first error bit and the second error bit by using the first syndrome and the second syndrome.

20. The method of operating the semiconductor memory device of claim 19, wherein the memory cell array includes a plurality of dynamic memory cells, and wherein the ECC engine is further configured to separate the first error bit and the second error bit generated in the first codeword by lapse to time and configured to sequentially correct the first error bit and the second error bit.

* * * * *